United States Patent [19]
Grant et al.

[11] Patent Number: 5,228,206
[45] Date of Patent: Jul. 20, 1993

[54] CLUSTER TOOL DRY CLEANING SYSTEM

[75] Inventors: Robert W. Grant, Excelsior; Richard E. Novak, Plymouth, both of Minn.

[73] Assignee: SubMicron Systems, Inc., Allentown, Pa.

[21] Appl. No.: 820,985

[22] Filed: Jan. 15, 1992

[51] Int. Cl.5 .............................................. F26B 3/28
[52] U.S. Cl. .......................................... 34/1; 34/1 Y; 34/17; 34/60; 432/124; 392/418
[58] Field of Search .............. 34/4, 12, 15, 1 W, 39, 34/40, 41, 17, 18, 1 Y, 1 Z, 1, 60; 432/120, 124, 152, 183, 198; 392/416, 418

[56] References Cited

U.S. PATENT DOCUMENTS

| 4,721,836 | 1/1988 | Zeisse et al. | 432/124 X |
| 4,857,704 | 8/1989 | Jannot et al. | 392/418 X |
| 5,019,689 | 5/1991 | Bollier et al. | 432/124 X |

Primary Examiner—Henry A. Bennet
Attorney, Agent, or Firm—Hugh D. Jaeger

[57] ABSTRACT

A cluster tool module for dry process cleaning of substrates. A substrate process reactor body assembly includes a gas inlet and gas outlet on opposing sides of a ceramic reactor body. A linear xenon flash lamp in a light bar provides a UV source for uniform distribution over a substrate by use of a light filter. Infrared heating is also provided by a plurality of infrared lamps in the light box. A moisturizer is provided for safe introduction of water vapor into the gas flow.

4 Claims, 9 Drawing Sheets

CLUSTER TOOL DRY CLEANING SYSTEM

BACKGROUND OF THE INVENTION

1. Field of the Invention

The present invention pertains to a substrate dry cleaning system, and more particularly, pertains to a cluster tool module for dry cleaning of a substrate in a controlled gaseous environment.

2. Description of the Prior Art

There have been many applications of chemistry for surface treatment of silicon and other wafers in the semiconductor industry. The uses of plasma generated ions have been used in the areas of etch and photoresist removal. These methods have been quite useful, but have a disadvantage of potentially causing damage to the substrate and surface layers. The use of aqueous chemicals is the current standard for wafer cleaning.

The emergence of gas based surface preparation techniques offer the "fine tuning" capabilities that are desirable to the vacuum based cluster tools. The processes that use dry gases or high vapor pressure gases are compatible to the vacuum processes. Reactant gases that combine with the intended contaminant form volatile compounds, such as HCL, $CL_2$, $F_2$ mixtures, or $O_2$, which are well known. It is not always desirable to heat the wafer above 200° C. or 300° C. because of the diffusion of impurities into the bulk material of the substrate. Another method of surface preparation is to perform wet chemical treatments.

The present invention provides a cluster tool module for gaseous dry cleaning of substrates.

SUMMARY OF THE INVENTION

The general purpose of the present invention is a cluster tool dry cleaning system for processing of a semiconductor wafer on a semiconduction substrate.

According to one embodiment of the present invention, there is provided a cluster tool module having a substrate process reactor body assembly where a substrate is cleaned using a gaseous cleaning process having a docking nose connected to an internal chamber of a reactor body, gas inlet and outlet ports on each side of the internal chamber in the reactor body, a sealed ultraviolet and infrared window aligned above the cavity in the reactor body where the substrate is processed, a means for slowly rotating a substrate, and a high powered xenon ultraviolet lamp and a plurality of IR lamps aligned in a lamp box over and above the sealed ultraviolet and infrared window, over and about the reactor body, and an outer lamp cover.

One significant aspect and feature of the present invention is a cluster tool module featuring gaseous substrate processing.

Another significant aspect and feature of the present invention is the use of UV light which is spread from a single source uniformly over the exposed surface of a substrate.

An additional significant aspect and feature of the present invention is the use of ceramic holed inlet and outlet plates to achieve smooth and even laminar flow over and about a substrate.

A further significant aspect and feature of the present invention is the use of a non-contaminating levitated core motor.

Still another significant aspect and feature o the present invention is a gas moisturizer where no direct physical contact between the gas and water occurs.

Other significant aspects and features of the present invention include the volume of the reactor that is very small. The benefit of the small reactor is that the change-over time from one gas to the next gas is minimized. Also, due to the smallness, the critical pumping real time provides for pumping a vacuum on a volume without causing rain to form; that is, without causing condensation. Because of the small volume, the high surface ratio to volume, the system has a very short pumping time, approximately 2.2 seconds. The very thin reactor assists with the vacuum considerations. The series of reflecting services provide a geometric system for the uniformity of light across the wafer surface. Three rectangle shapes or other geometrical shapes are stacked on top of each other, such as ellipses. The material can be sapphire or other suitable materials. This provides for uniformity and processing control of UV light in a reactor.

Having thus described one embodiment of the present invention, it is the principal object hereof to provide a cluster tool dry cleaning system as a module for the gaseous processing of substrates.

One object of the present invention is a cluster tool module which corresponds to an MESC footprint for the physical size of the system.

Another object of the present invention is a cluster tool dry cleaning system which is a module providing for mating with other MESC processing equipment and MESC gate valve systems.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DESCRIPTION OF THE PREFERRED EMBODIMENTS

Figure 1:
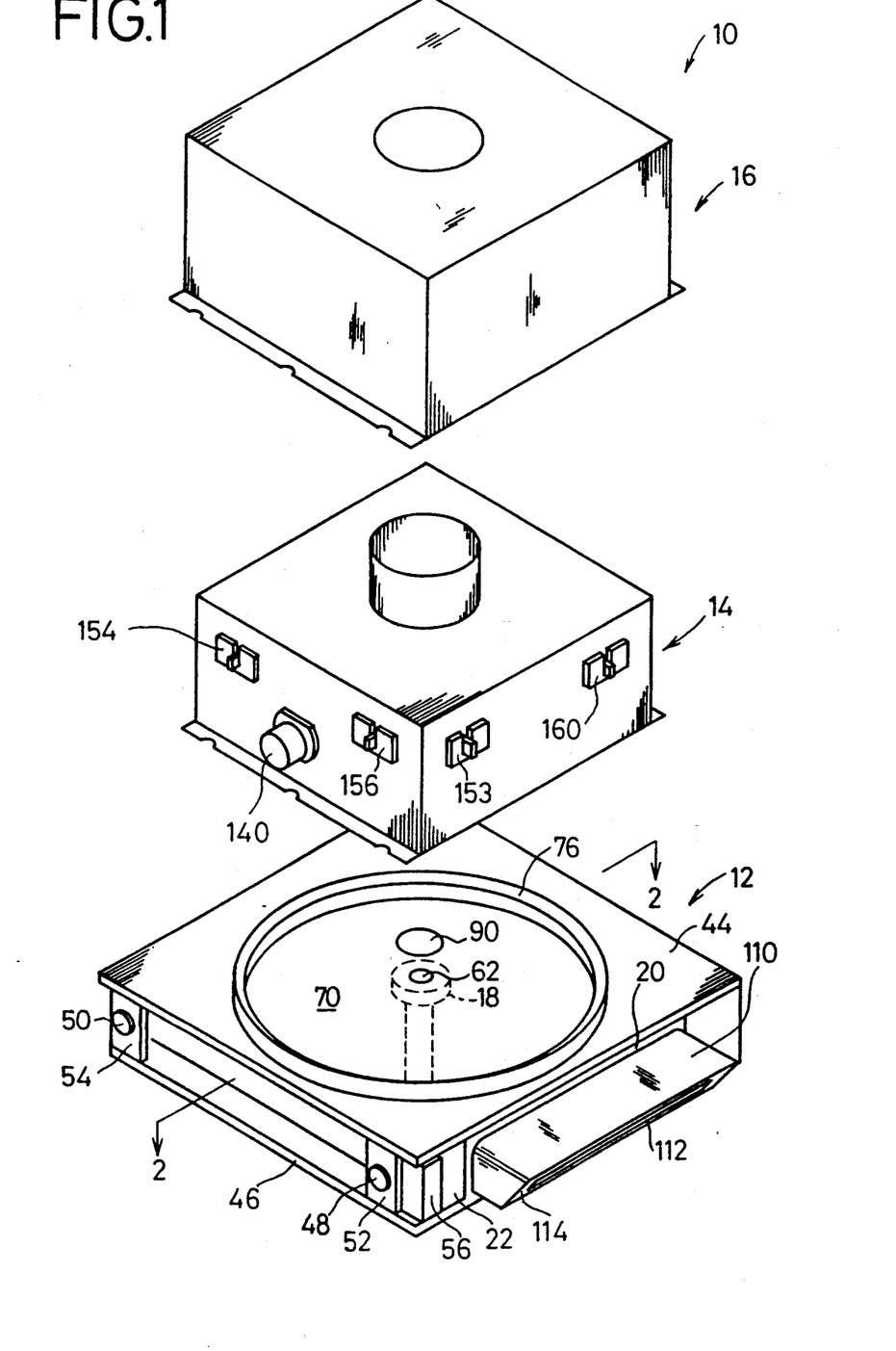
FIG. 1 illustrates an exploded view of the present invention.

FIG. 1 illustrates an exploded view of a cluster tool module 10 for dry cleaning of silicon and other wafers found in the semiconductor industry. The cluster tool module 10 includes a substrate process reactor body assembly 12, a lamp box 14, an outer lamp cover 16 and a motor 18.

Figure 2:
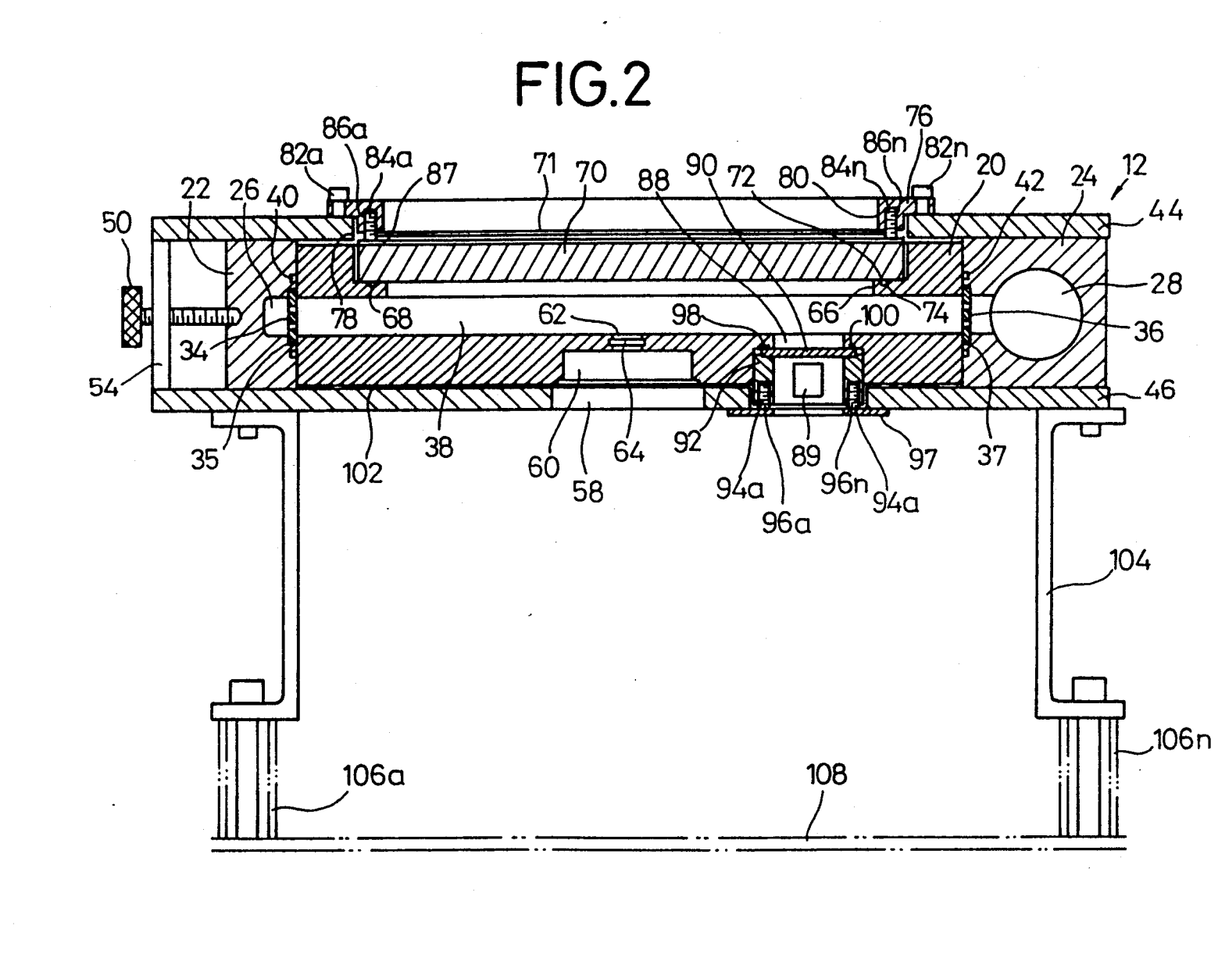
FIG. 2 illustrates a side view in cross section of the substrate process reactor body assembly.
Figure 3:
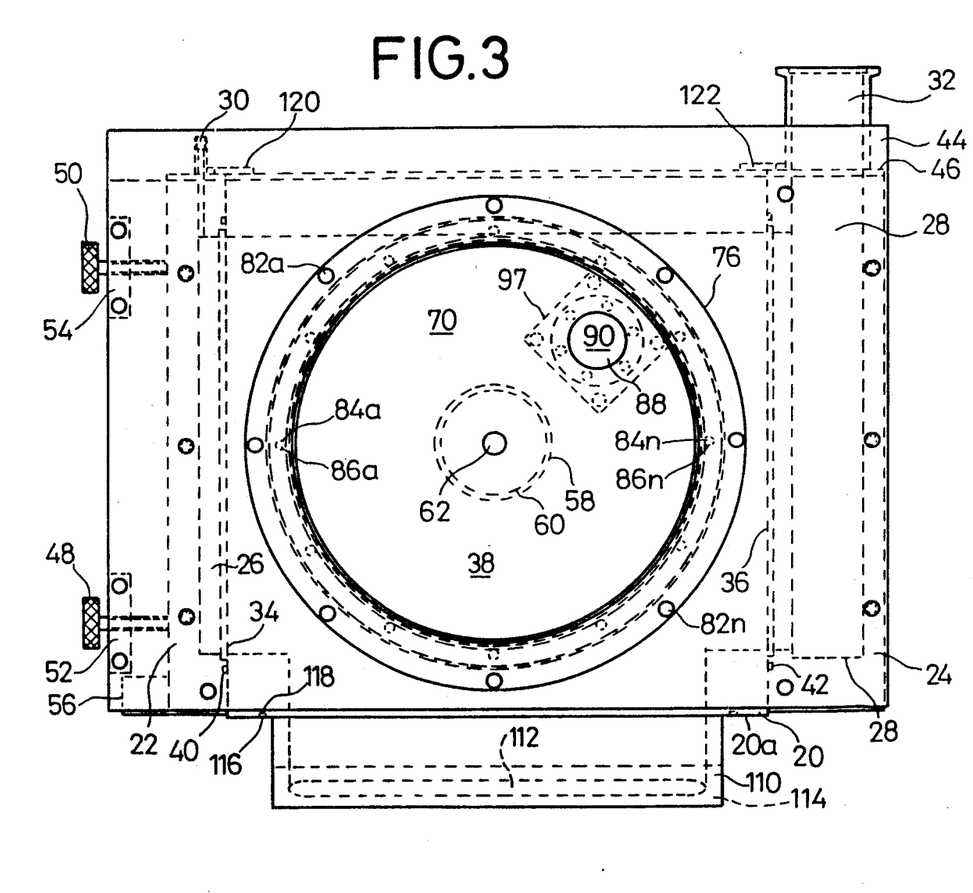
FIG. 3 illustrates a top view of the substrate process reactor body assembly.

FIG. 2 illustrates a cross sectional view detail of the reactor body assembly 12 along line 2—2 of FIG. 1. The reactor body assembly 12 is built about a silicon carbide coated graphite ceramic reactor body 20, which in the alternative can be of aluminum nitride or aluminum oxide. A gas inlet manifold 22 and a gas outlet manifold 24 flank opposing sides of the reactor body 20. Lumens 26 and 28 in the gas inlet manifold 22 and the gas outlet manifold 24 lead to gas inlet and outlet connector ports 30 and 32 as illustrated in FIG. 3. The gas inlet manifold 22 and the gas outlet manifold 24 are platinum plated to prevent corrosion. Ceramic holed plates 34 and 36, of high purity aluminum oxide, form portions of the walls of the lumens 26 and 28, respectively, and align in recesses 35 and 37 of the inlet and outlet manifolds 22 and 24. The number of holes in each plate are arranged to provide equal and uniform flow of cleaning gases introduced through the gas inlet manifold 22, across an internal chamber 38 and through the gas outlet manifold 24. O-rings 40 and 42 reside appropriately in one face of the gas inlet manifold 22 and the gas outlet manifold 24 to seal against the reactor body 20. The gas outlet manifold 24, the gas inlet manifold 22 and the reactor body 20 align between upper and lower plates 44 and 46. The gas outlet manifold 24 fixedly attaches between the upper and lower plates 44 and 46. The reactor body 20, gas inlet manifold 22, and gas outlet manifold 24 are held in compression with each other by action of thumb screws 48 and 50 in plates 52 and 54, which are secured and vertically aligned between plates 44 and 46 as illustrated in FIGS. 2 and 3. A claw clip bracket 56 secures between the upper and lower plates 44 and 46 as illustrated in FIGS. 1 and 3. A motor mounting cavity 58 in the lower plate 46 align concentrically with a motor mounting cavity 60 and a motor shaft hole 62 in the reactor body 20. An O-ring 64 also aligns in the motor shaft hole 62. A circular opening 66 is located central to the reactor body 20. An annular seat 68 aligns concentrically above the circular opening 66 to accommodate a circular calcium fluoride ultraviolet and infrared window 70. A sapphire lens 71 aligns and is suspended over the window 70. The sapphire lens 71 distributes light in a very even pattern downwardly through the window 70. The lens 71 is discussed in detail in FIG. 9. In the alternative, the window 70 can be of sapphire composition. An O-ring 72 aligns in an annular groove 74 in the annular seat 68 to seal the internal chamber 38 formed by the ultraviolet and infrared window 70 and the internal cavity portion of the reactor body 20. A configured lens hold down ring 76 aligns and secures in and about a circular opening 78 in the upper plate 44. The lens hold down ring 76 includes a large orifice 80 which allows light access to the window 70. A plurality of fasteners 82a-82n secure the lens hold-down ring to the upper plate 44. A plurality of compression springs 84a-84n align in spring cavities 86a-86n in the lens hold down ring 76 to exert pressure downwardly against a flat circular protective ring 87 on the upper side of the window 70 to provide a live seal against the O-ring 72. A multi-radius small orifice 88 in the lower plate 46 allows for mounting of a coated germanium IR window 90 which is held in place by a cylindrical lens holder 92. A plurality of compression springs 94a-94n align in a plurality of spring cavities 96a-96n to exert pressure between the lens holder 92. The net effect is that the coated germanium IR window 90 is sealed by spring pressure against an O-ring 98 aligned in an annular groove 100 in the multi-radius orifice 88. An IR sensor 89 aligns in the multi-radius cavity 88. Another flat protective ring 102 aligns between the bottom of the reactor body 20 and the upper surface of the lower plate 46. All O-rings are made of unloaded fluoropolymer based material, such as Greene-Tweed 503 which is resistant to corrosive environments. The entire reactor body assembly 12, lamp box 14 and outer lamp cover 16 are mounted on a framework 104 which is spring mounted by a plurality of springs 106a-106n to a platform 108 to facilitate stress free cluster docking.

FIG. 3 illustrates a top view of the substrate process reactor body assembly 12 where all numerals correspond to those elements previously described. Illustrated in particular is a member of the reactor body 20 known as the docking nose 110. An oval shaped orifice 112 on the beveled face 114 is aligned with and is integral to the internal chamber 38 of the reactor body 20 and allows for insertion of a substrate structure into the reactor body 20. An O-ring 116 aligns in a groove 118 on the front face 20a of the reactor body 20 for sealed mating with an external handler. Also illustrated are rear clips 120 and 122.

Figure 4:
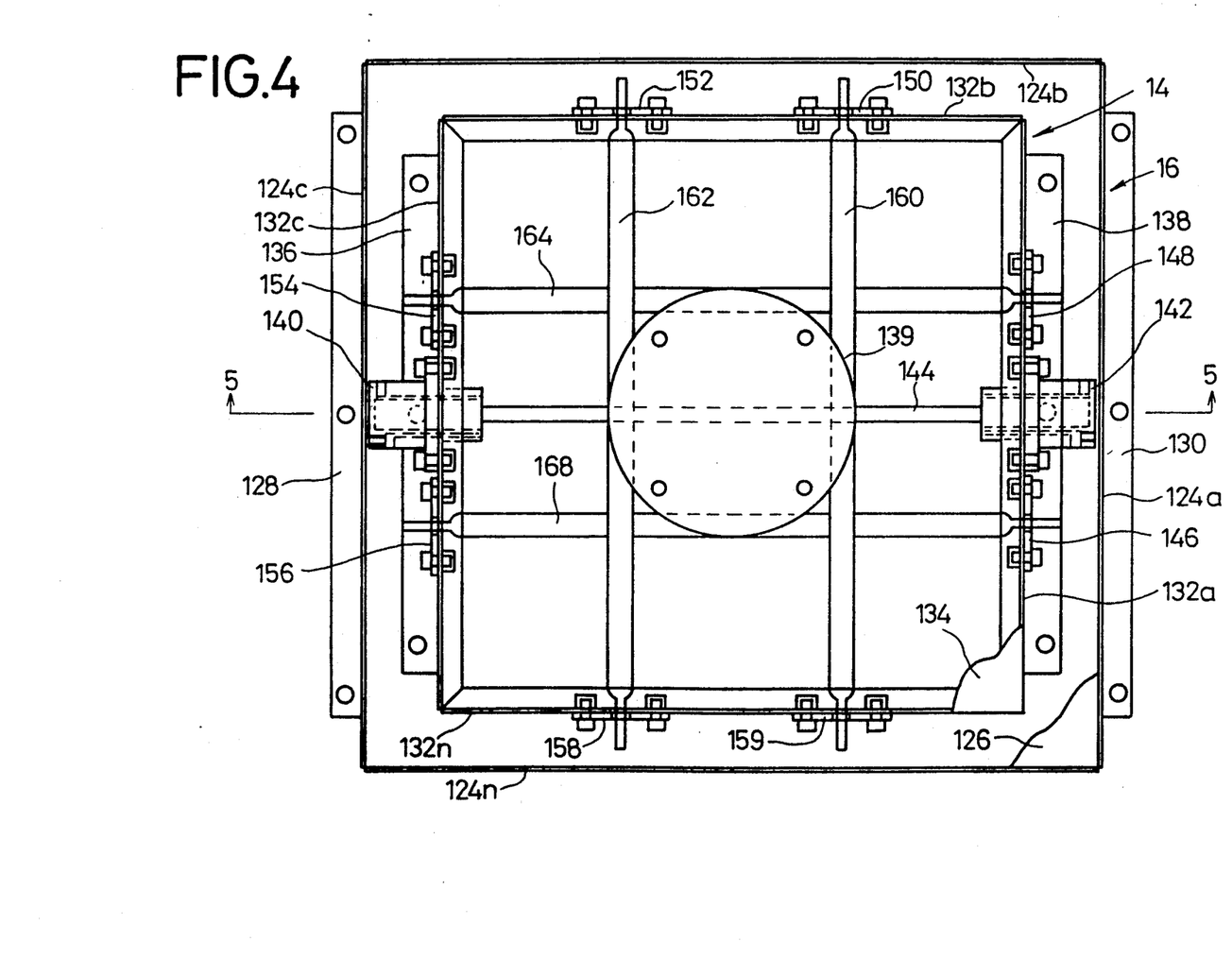
FIG. 4 illustrates a top view of the lamp box and outer lamp cover.

FIG. 4 illustrates a top view in cutaway of the lamp box 14 nested in the outer lamp cover 16 where all numerals correspond to those elements previously described. The outer lamp cover 16 includes a plurality of sides 124a-124n, a top 126, and flanges 128 and 130. The lamp box 14 includes a plurality of sides 132a-132n, a top 134 and flanges 136 and 138. An air damper plate 139 is also illustrated and described in FIG. 5. Ceramic mounts 140 and 142 mount in sides 132c and 132a of the lamp box 14 to accommodate an xenon lamp 144 aligned across the lamp box 14. At a higher level in the lamp box 14, a plurality of ceramic mounts 146, 148, 150, 152, 154, 156, 158 and 159 mount as illustrated on the appropriate box sides 132a-132n. A plurality of tungsten lamps 160, 162, 164 and 166 align in the appropriate ceramic mounts 146-159. Where pairs of tungsten lamps 160-162 are in a perpendicular alignment to the remaining tungsten lamp pairs 164-168. The ceramic mounts 140-142 and 146-159 are ceramic for both electrical and thermal isolation. The outer lamp cover 16 encloses high voltage connections, blocks and light leaks and provides inlet air ducting.

Figure 5:
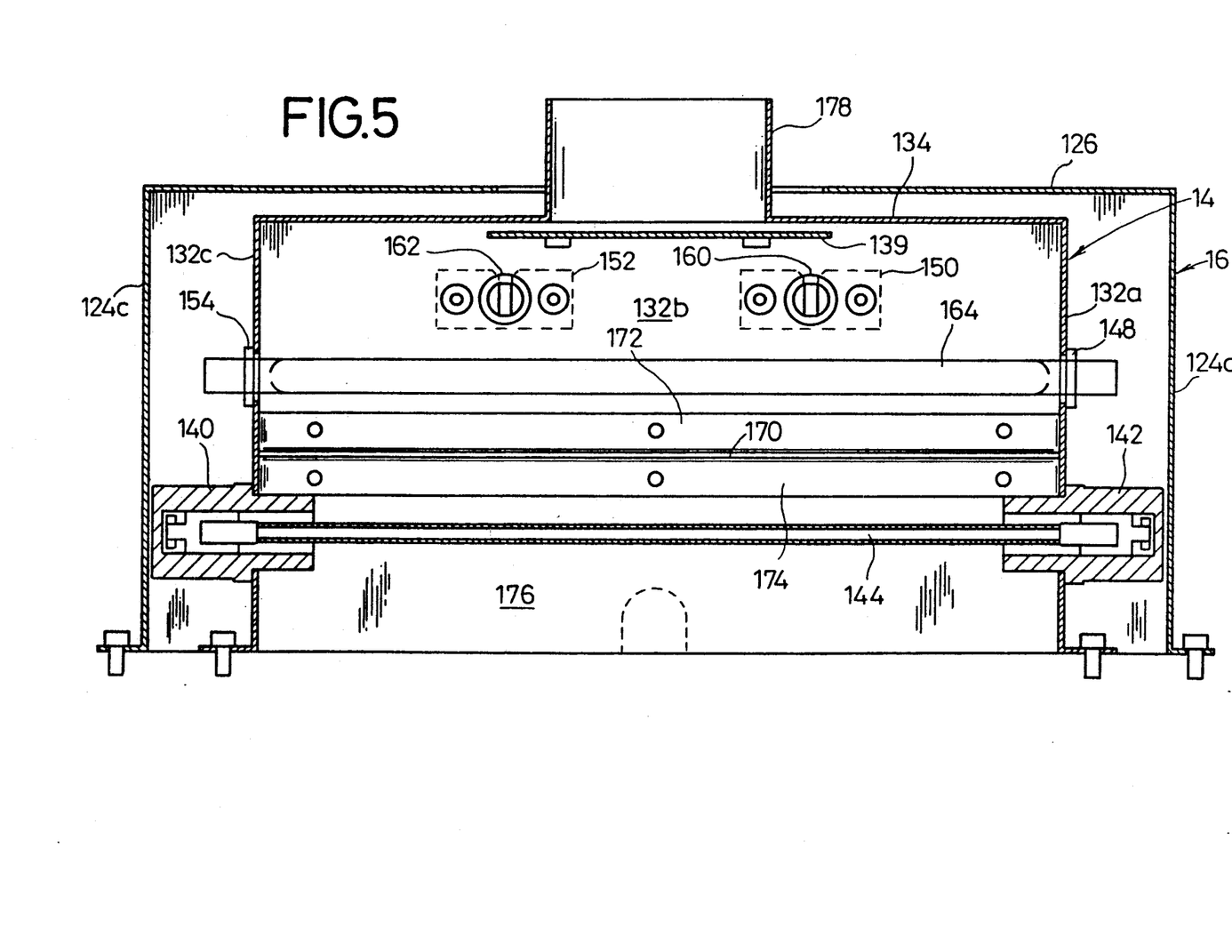
FIG. 5 illustrates a view in cross section of the lamp box and outer lamp cover along line 5—5 of FIG. 4.

FIG. 5 illustrates a side view in cross section of the lamp box 14 aligned with the outer lamp cover 16 along line 5—5 of FIG. 4 where all numerals correspond to those elements previously described. Illustrated in particular is a UV light stop filter 170 of Pyrex glass which mounts across the midsection of the lamp box 14. An upper mounting rail 172 and a lower mounting rail 174 secure to the interior of the lamp box 14, namely the sides 132a-132n. UV light stop filter 170 aligns and is held between the upper and lower rails 172 and 174. The lower area 176 of the lamp box 14, beneath the UV stop filter 170, is purged with non-UV absorbing nitrogen. A chimney 178 extends vertically from the top 134 of the light box 134 and also aligns above the damper 139 which is adjustable to control air temperature in the light box 14.

Figure 6:
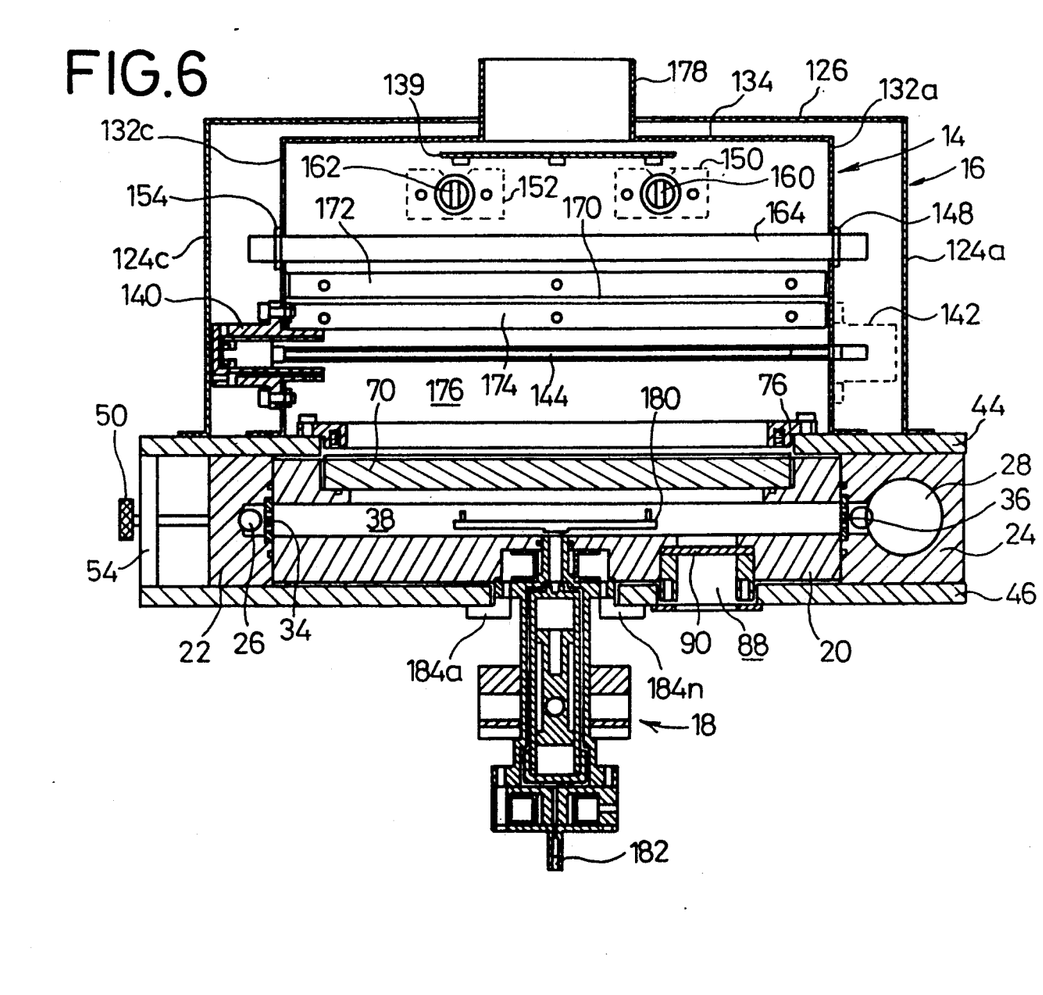
FIG. 6 illustrates an assembled view in cross section of the major components of the present invention.

FIG. 6 illustrates a cross-sectional view of the assembled cluster tool module 10 where all numerals correspond to those elements previously described. Illustrated in particular is the rotational wafer chuck 180 of which is ceramic coated graphite and high purity aluminum oxide. The motor 18 is frictionless and includes an N₂ purge/over pressure relief port 182. The chuck rotates at about 15 RPM and provides one index position. The motor 18 is mounted on the bottom of the reactor with a plurality of mounting dogs 184a-184n.

Figure 7:
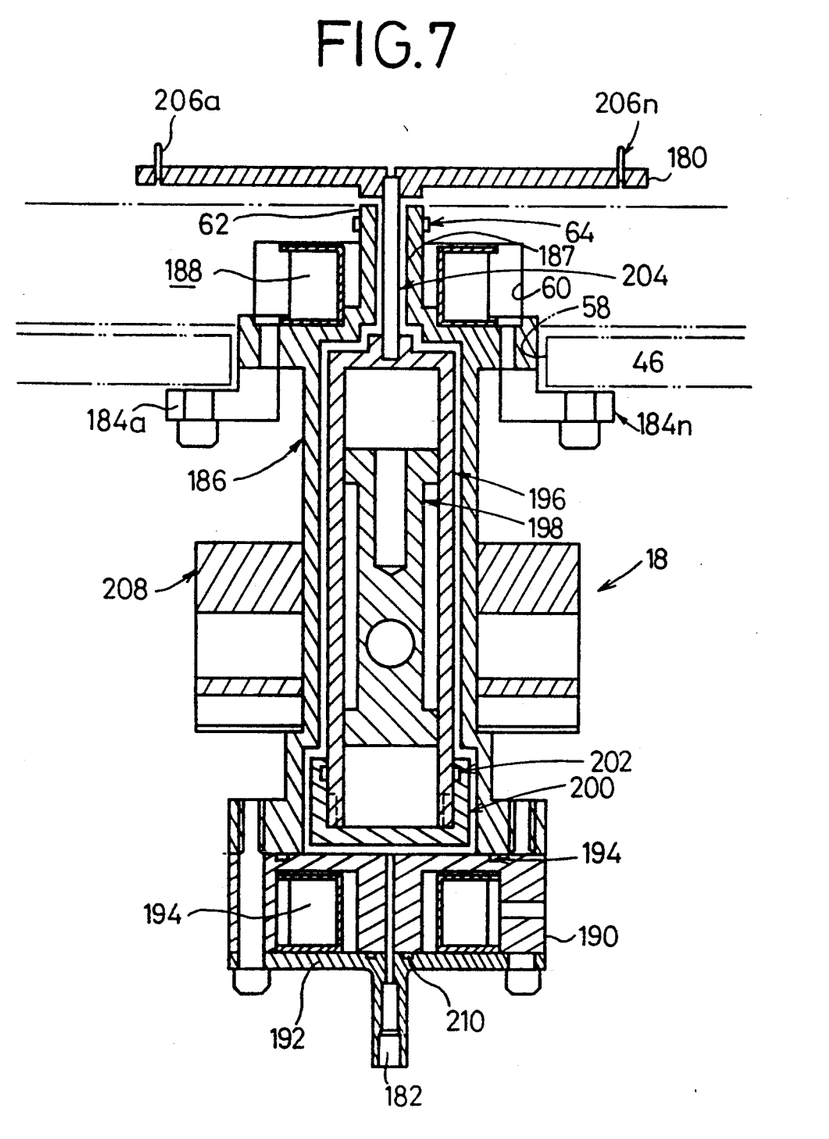
FIG. 7 illustrates a view in cross section of the levitated motor.

FIG. 7 illustrates a cross-sectional view of the motor 18 secured to the bottom plate 46 by mounting dogs 184a-184n where all numerals correspond to those elements previously described. The motor housing 186 aligns in the motor mounting cavity 58 in plate 46 and the levitation coil 188 aligns in the motor mounting cavity 60 in the reactor body 20. The motor housing 186 includes a cylindrical and hollow extension 187 aligned in the motor shaft hole 62 which is sealed by an O-ring 64. A lower Cap 190 and a purge plate 192 secure to the bottom portion of the motor housing 186 with appropriate fasteners. Levitation coil 188 aligns in the lower cap 190. An O-ring 194 seals the lower cap 190 to the lower portion of the motor housing 186. A motor body 196, a spool 198 and a motor body cap 200 align in a levitated fashion with the motor body cap 200 align in a levitated fashion with the motor housing 186. An O-ring 202 seals the spool 198 to the motor body cap 200. A Ceramic shaft 204 extends through the cylindrical and hollow extension 187 from the motor body 196 and secures to the rotational wafer chuck 180. A plurality of ceramic pins 206a-206n extend vertically from the rotational wafer chuck 180. A split ring 208 secures over and about the motor housing 186. The purge/over pressure port 182 connects to the interior of the motor housing 186. An O-ring 200 seals the lower cap to the purge plate 192.

Figure 8:
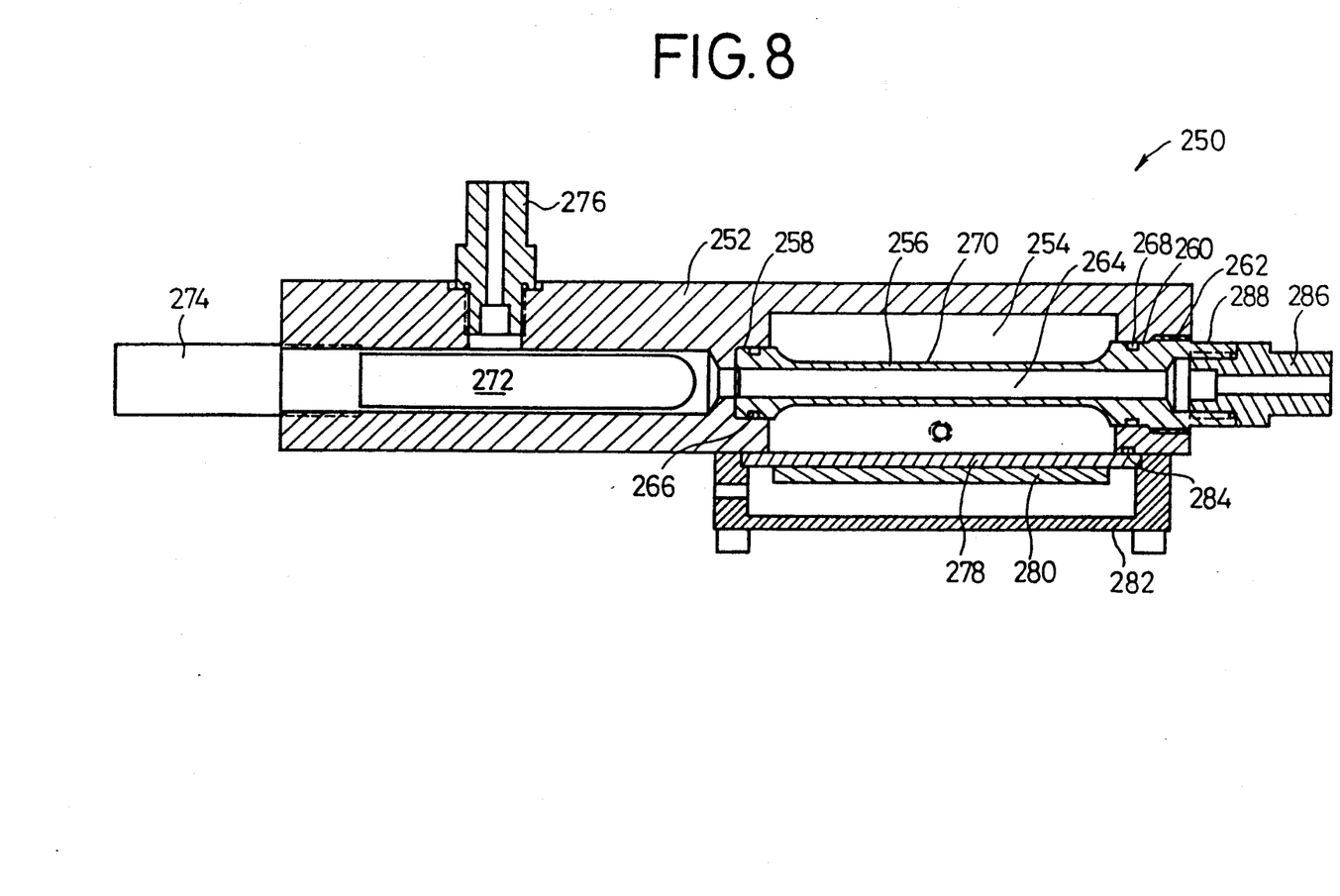
FIG. 8 illustrates a view in cross section of the moisturizer.

FIG. 8 illustrates a moisturizer 250 for safe injection of a small amount of water vapor into a flow of gas. The moisturizer 250 is built about a polymer block 252 having a cavity 254 at on end. A moisturizer stem 256 aligns in a bore 258 in the center portion of the polymer block 252 and in another bore 260 and thread set 262 at on end of the polymer block 252. The moisturizer stem 256 includes a central bore 264 along its axis. O-rings 266 and 268 align in the appropriate annular grooves to seal the moisturizing stem 256 against the cavity 254. The moisturizing stem 256 is manufactured to the required permeability so that water or other desired chemical solutions can permeate the moisturizing stem wall 270. A cavity 272 plumbs to the bore 264 and includes a plug type capacitive sensor 274 for sampling of moisture content of a gas passing through the bore 264 and then through the cavity where the moisturized gas subsequently exits through an exhaust port 276. A ceramic heater plate 278 with an attached foil heater 280 forms one side of the cavity 254 and is held in place with a heater clamp plate 282. The heater cover plate 278 seals against the polymer block 252 with an O-ring 284 in an appropriate groove. A connector 286 is illustrated in connection with the outboard end 288 of the moisturizer stem 256.

Water in the cavity 25 surrounding the moisturizing stem 256 enters the bore 26 and thus the as flowing in the bore 264 at a specified rate which is determined by a number of factors, some of which include the density of the moisturizer tube 256, the thickness of the tube wall 270, the temperature of the water in the cavity 254 as heated by the heater plate 278, and flow and pressure rates of the gases traversing the moisturizer stem 256.

Heating the water modestly in the neighborhood of up to 60 or 70 degrees C. will change the permeability or the rate of diffusion of moisture through the tube wall 270. At the end of the cell, the capacitive sensor 274 which is basically a humidity sensor, gives a real time measurement of exactly how much moisture is getting through the stem wall 270 and into the gas stream so that closed loop control can be effected by either changing the flow of the gas, which will change its moisture content in parts per million, or by changing the temperature to either increase or decrease the permeation or diffusion through the stem wall 270.

The gas flows through the moisturizing stem 256 so that there is never any direct contact between the water and the gas, such as in a bubbler style moisturizer. The water has to permeate through the wall of the polymer. The moisturizer stem 256 can be Teflon PFA material, PVDF, polyvinyldeine di-fluoride, nylon, or any other suitable material. The moisturizer 250 is unique in that there are no moving parts, such as valves or check valves, to wear or break down as in other moisturizer systems whereby any leakage could be extremely detrimental to the internal handler and processor components.

Figure 9:
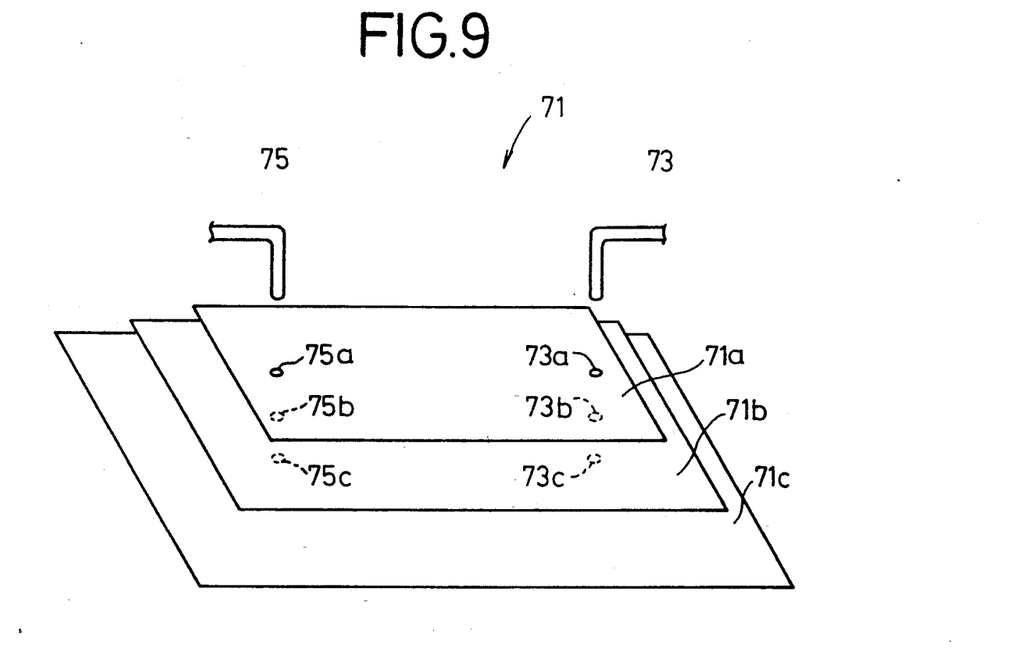
FIG. 9 illustrates a perspective exploded view of a sapphire lens.

FIG. 9 illustrates an exploded view of a sapphire lens 71 where all numerals correspond to those elements previously described. The lens 71 is constructed to distribute UV light in a uniform manner in a geometric fashion. The lens 71 includes sandwiched layers 71a, 71b and 71c of very thin sapphire where the length and width dimensions of each grow progressively larger from layers 71a to 71c the resultant being that UV is filtered more where the virtual thickness of the entire lens 71 is collectively the thickest. The layers 71a-71c are appropriately dimensioned so that the light is within a 4% uniformity factor when it radiates upon its intended target beneath the ultraviolet and infrared window 70. Mounting wires 73 and 75 pass through holes 73a, 73b, 73c and 75a, 75b and 75c in respective layers 71a-71c for subsequent mounting above the window 70.

MODE OF OPERATION

FIG. 6 best illustrates the mode of operation in conjunction with the other attendant figures. The cleaning or pretreatment module is intended to support critical cluster operations such as RTO, CVD, PVD, post RIE and other critical vacuum based processes. For the most part, it utilizes water vapor free processing. This should be of great interest due to the great difficulty in reducing residual water and other condensables. The multiplicity of gas streams and the use of xenon pulse (for chemical stimulation) as well as tungsten lamps (for wafer heating) make the proposed module ideal for known and developing processes.

The ultraviolet light system is designed to uniformly illuminate the wafer surface with up to 250 mWatts/cm² light with wavelengths as short as 150 nm. This is very much improved over the usual use of mercury lamps which put out 40 mWatt/cm² down to about 180 nm in wave length. The system uses a linear xenon flash lamp operating at 120 cps. This approach provides greater penetration power via the $10^6$ watts per flash.

A novel UV light stop 170 converts the linear lamp radiation intensity pattern into a 90% plus uniformity of short wave radiation across the wafer. This method utilizes three computer modeled reflective surfaces which reduce the UV light in a way that produces a high degree of uniformity across the wafer. This light filter 170 has little affect on the IR light intensity.

The space between the xenon lamp 144 and the reactor window 70 is purged with non-UV absorbing nitrogen. This space is about 6 cm. The distance that must be traversed within the photo-absorbing gas in the reactor 20 is less than one cm. The space above the xenon lamp 144 is filtered by a pane of boro-silicate glass, non-transparent to UV, which prevents the unwanted formation of ozone in the lamp cooling air flow.

In order to utilize the proper UV wavelengths, a sapphire bulb envelope is incorporated. This is most effective in transmitting the deep UV light that is normally filtered out by the fused silica envelope of an everyday lamp. The calcium fluoride or sapphire reactor window 70 will transmit these wavelengths, as well as longer wavelengths which are useful in the IR heating system.

In order to heat the wafer to expected processing temperatures varying between 20° and 400° C. accurately, IR lamps 160-168 are provided in a simple reflector box 14 The expected temperature variation across the wafer is $+/-$ 5° C. The control is by closed loop design utilizing an SCR and an 8 to 14 micron wavelength infrared sensor, which operates well over the range of the IR lamps. The viewing window 90 is coated germanium, which has excellent transparency and corrosion protection for these conditions.

Note that the reactor body 20 and holed plates are ceramic parts. The body 20 is silicon carbide coated graphite, and can be aluminum nitride or aluminum oxide as desired. The body of the reactor 20 is held in compression, and does not utilize any other type of fastening. The UV and IR window 70 is currently calcium fluoride, and can be changed to sapphire if necessary. The window O-ring is shaded and held down by a mounting ring 70 and small coil springs 84a-84n. The coated germanium IR window 90 is held in by a lens holder 92 and coil springs 94a-94n. The whole reactor assembly 12 and light box 14 are mounted on four coil springs, facilitating cluster docking by allowing small movements. The gas outlet to pump and gas inlet manifolds 24 and 22 are both nickel or platinum plated. The two holed plates 34 and 36 are composed of high purity aluminum oxide.

In the light box, both the tungsten 160-168 and the xenon lamp 144 are held with ceramic mounts for both electrical and thermal isolation. The air damper 139 is used to control the air flow through the tungsten lamps 160-168. The area below the UV light stop filter 170 is purged with nitrogen. The tungsten lamps utilize soldered wire leads. The outer box encloses the high voltage connections, blocks any light leaks, and provide inlet air ducting.

Various modifications can be made to the present invention without departing from the apparent scope hereof.

We claim:
1. Cluster tool dry cleaning system comprising:
    a. a ceramic reactor body including a gas inlet, a gas outlet and wafer orifice;
    b. a light box over said ceramic reactor body;
    c. a light source means in said light box; and,
    d. means for supporting and rotating a wafer or substrate in said body.
2. Cluster tool dry cleaning system comprising:
    a. a ceramic reactor body including a gas inlet, a gas outlet and wafer orifice;
    b. a light box over said ceramic reactor body;
    c. a UV source means in said light box;
    d. an IR source means in said light box;
    e. a moisturizing means; and,
    f. means for supporting and rotating a wafer or substrate in said body.
3. The system of claim 2 including means for dispersing said UV radiation.
4. Cluster tool dry cleaning system comprising:
    a. a small ceramic reactor body including a gas inlet, a gas outlet and wafer orifice;
    b. a light box over said ceramic reactor body;
    c. a UV source means in said light box;
    d. an IR source means in said light box;
    e. a moisturizing means; and,
    f. means for supporting and rotating a wafer or substrate.

* * * * *